(12) United States Patent
Hirano

(10) Patent No.: US 6,714,459 B2
(45) Date of Patent: Mar. 30, 2004

(54) NONVOLATILE SEMICONDUCTOR MEMORY DEVICE AND METHOD OF DETECTING OVERERASED CELL

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/241,752

(22) Filed: Sep. 12, 2002

(65) Prior Publication Data

US 2003/0067818 A1 Apr. 10, 2003

(30) Foreign Application Priority Data

Sep. 12, 2001 (JP) .................................... 2001-276884

(51) Int. Cl.⁷ .............................................. G11C 16/04
(52) U.S. Cl. ............................. 365/185.3; 365/185.29; 365/185.33
(58) Field of Search ...................... 365/185.11, 185.2, 365/185.22, 185.29, 185.3, 185.33

(56) References Cited

U.S. PATENT DOCUMENTS

| | | | | |
|---|---|---|---|---|
| 5,237,535 A | * | 8/1993 | Mielke et al. ............ | 365/185.3 |
| 5,598,368 A | * | 1/1997 | Takahashi et al. ...... | 365/185.01 |
| 5,642,311 A | * | 6/1997 | Cleveland et al. ....... | 365/185.3 |
| 6,122,198 A | * | 9/2000 | Haddad et al. ......... | 365/185.22 |
| 6,442,074 B1 | * | 8/2002 | Hamilton et al. ....... | 365/185.29 |
| 6,483,752 B2 | * | 11/2002 | Hirano ................... | 365/185.33 |
| 6,532,175 B1 | * | 3/2003 | Yachareni et al. ...... | 365/185.22 |

FOREIGN PATENT DOCUMENTS

JP     6-290596     10/1994

* cited by examiner

*Primary Examiner*—Son Mai
(74) *Attorney, Agent, or Firm*—Morrison & Foerster LLP

(57) ABSTRACT

In a nonvolatile semiconductor memory device, overerase-verify in an erase operation is conducted in units of bit lines in a batch. A cell current of a reference cell and voltage applied to a word line of a main cell are set so as to have a detection level at which there can be one or no memory cell having a threshold voltage of 0.5 V at time of one overerase-verify operation and a leak current of an unselected memory cell can be 1 $\mu$A or lower in a normal operation. Thus, the number of verify times in the overerase-verify is reduced to shorten period of time in the overerase-verify and thereby achieve high-speed erase. Furthermore, a cell current can be reduced to achieve lower power consumption.

14 Claims, 12 Drawing Sheets

NONVOLATILE SEMICONDUCTOR MEMORY DEVICE AND METHOD OF DETECTING OVERERASED CELL

BACKGROUND OF THE INVENTION

The present invention relates to a nonvolatile semiconductor memory device enabling high-speed erase where a low threshold is used as an erased state, and to a method of detecting an overerased cell in the nonvolatile semiconductor memory device.

Conventionally, ETOX (EPROM Thin Oxide: brand name of an Intel product) is used as the most commonly used flash memory. FIG. 12 is a schematic cross sectional view showing this ETOX-type flash memory cell. As shown in FIG. 12, a floating gate 5 is formed on a source 1, a drain 2 and a substrate (well) 3 between the source and the drain via a tunnel oxide film 4. A control gate 7 is formed on the floating gate 5 via an interlayer insulating film 6.

The operation principle of the ETOX-type flash memory will be explained below. As shown in Table 1, at the time of write, a voltage Vpp (for example, 10 V) is applied to the control gate 7, a reference voltage Vss (for example, 0 V) is applied to the source 1, and a voltage of 6 V is applied to the drain 2. Consequently, a large amount of current is allowed to flow in a channel layer, hot electrons are generated in a portion on the drain 2 side where an electric field is high, and electrons are implanted into the floating gate 5. As a result, a threshold voltage rises, and data is written to the memory cell. FIG. 13 shows threshold voltage distributions in a written state and an erased state. As shown in FIG. 13, the threshold voltage of a written memory cell is 5 V or higher. It is noted that open of the drain 2 in Table 1 means a voltage applied to the drain 2 of a memory cell to which data is not to be written.

TABLE 1

| | Control gate 7 | Drain 2 | Source 1 | Substrate 3 |
|---|---|---|---|---|
| Write | 10 V | 6 V/open | 0 V | 0 V |
| Erase | −9 V | Open | 6 V | 0 V |
| Read | 5 V | 1 V | 0 V | 0 V |

Furthermore, at the time of erase, a voltage Vnn (for example, −9 V) is applied to the control gate 7, a voltage Vpe (for example, 6 V) is applied to the source 1, and the drain 2 is made open to pull electrons from the floating gate 5 to the source 1 side and lower the threshold voltage. As a result, the threshold voltage of an erased memory cell becomes 1.5–3 V as shown in FIG. 13.

At the time of read, a voltage of 1 V is applied to the drain 2 and a voltage of 5 V is applied to the control gate 7. Then, when the memory cell is in an erased state, that is, when the threshold voltage is low, a current is allowed to flow into the cell and its state is determined as "1". On the other hand, when the threshold voltage is high and the memory cell is in a written state, a current is not allowed to flow into the cell and its state is determined as "0".

According to such an operation principle as the above, write, erase and read operations are performed. At the time of erase in an actual device, processing is performed in units of relatively large blocks of 64 kB for example. Meanwhile, some memory cells in a block where the erase processing is performed have a threshold voltage in a program state (high voltage) and others have a threshold voltage in an erased state (low voltage). That is, memory cells having two kinds of threshold voltages shown in FIG. 13 are mixed.

In this case, when an erase pulse is further added to memory cells in an erased state, the threshold voltages of the memory cells already in an erased state become in an excessively erased (overerased) state. Also, when there are memory cells whose threshold voltages decrease more rapidly than those of other memory cells due to variation in erase characteristic, the threshold voltages of the memory cells whose threshold voltages decreases more rapidly than others become in an overerased state. This is particularly problematic when the overerased state progresses, resulting in a negative threshold voltage.

In general, 0 V is applied to control gates of unselected memory cells at the time of read, write-verify or erase-verify. However, when a memory cell having a negative threshold voltage exists among the unselected memory cells, a cell current is allowed to flow into this memory cell although the memory cell is not selected. Therefore, when a selected memory cell M00 and an overerased cell M (1023, 0) are connected to the same bit line BL0 as shown in FIG. 14, a cell current flowing into the unselected overerased cell M (1023, 0) is added to the cell current flowing into the selected memory cell M00. Thus, the cell current measured in the bit line BL0 has a large value. Therefore, the threshold voltage of a program cell is apparently determined as low (an erased state). Thus, when a memory cell having a negative threshold voltage exists, an operation cannot be performed precisely at the time of the read, write-verify or erase-verify, and, as a result, a normal device operation cannot be performed.

In order to prevent such a problem, a complicated erase algorithm is used at the time of erase so that no memory cell having a negative threshold voltage exists. FIG. 3 shows the fundamental algorithm.

In FIG. 3, when an erase operation is started, first, a program before erase is performed for all memory cells in step S1. The voltage applied at this time is the same as that of the write operation described above.

In step S2, verify of the program before erase is performed. Detail description thereof is not given here, however, as a result of the verify of the program before erase, if there exists even one memory cell whose threshold voltage does not reach a predetermined voltage (5.0 V or higher in FIG. 13) because the program state is insufficient, the program is performed for the memory cell again, and the program and the verify are repeated until the threshold voltage of the memory cell becomes the predetermined voltage (5.0 V) or higher. Then, when the threshold voltage of the memory cell becomes the predetermined voltage (5.0 V) or higher, the program proceeds to the address of the next memory cell. Thus, when threshold voltages of all memory cells become the predetermined voltage or higher, the verify of the program before erase is terminated.

In step S3, an erase pulse is applied. This erase pulse application processing is performed in a unit of blocks. That is, data is erased in all memory cells in a block at the same time by making the drain 2 open to apply −9 V to the control gate 7 and 6 V to the source 1.

In step S4, when the erase pulse application is terminated as described above, erase-verify is performed to determine whether all memory cells in the block have a predetermined threshold voltage or lower (3 V or lower in this case). Detail description is not given here, but, when a memory cell whose threshold voltage is not the predetermined voltage or lower is found, erase-verify is once stopped, and an erase pulse is applied again. This operation is repeated until threshold voltages of all memory cells become the predetermined voltage or lower.

In step S5, overerased cell detection and a soft program described in detail later are performed. Then, the erase operation is terminated.

FIG. 15 shows a general algorithm of the overerased cell detection performed in step S5 in the flow chart of the erase operation shown in FIG. 3. Hereafter, operations in the overerased cell detection and the software program will be explained in reference to a flow chart shown in FIG. 15 and array configuration of a flash memory shown in FIG. 2. In FIG. 2, the flash memory cell array is configured by memory cells M arranged in a matrix, word lines WL connected to control gates of the memory cells M arranged in the line direction, bit lines BL connected to drains of the memory cells M arranged in the column direction and a common source line SL for connecting sources of all the memory cells M00 to M (1023, 511) constituting a block.

In FIG. 15, an initial value "0" is set in a column address CA (=bit line BL number) in step S11. In step S12, an initial value "0" is set in a row address RA (=word line WL number). In step S13, a threshold voltage Vt of a memory cell M (RA, CA) is verified, the memory cell M (RA, CA) being positioned at an intersection of the row address RA and the column address CA. In step S14, as a result of this verification, it is judged whether the threshold voltage Vt of the memory cell M (RA, CA) is higher than 0.5 V. As a result, when the threshold voltage is higher than 0.5 V, it is determined that the memory cell M (RA, CA) is not in an overerased state, and processing proceeds to step S15. On the other hand, when the threshold voltage is 0.5 V or lower, it is determined that the memory cell M (RA, CA) is in an overerased state (verify is performed), and processing proceeds to step S19.

In step S15, the row address RA is incremented. As a result, when word line WL0 is selected in step S12, word line WL1 is selected. In step S16, it is judged whether the row address RA is final address $RA_{MAX}$ (=1024) or higher. As a result, when the row address is the final address $RA_{MAX}$ or higher, processing proceeds to step 17, and, when the row address is lower than the final address $RA_{MAX}$, processing returns to the aforementioned step S13 and the threshold voltage Vt of the next memory cell M (RA, CA) is verified. That is, when word line WL1 is selected in the aforementioned step S15, the threshold voltage Vt of a memory cell M10 positioned at the intersection of word line WL1 and bit line BL0 is verified.

In step S17, it is judged whether the column address CA is the final address $CA_{MAX}$ (=512) or higher. As a result, when the column address is the final address $CA_{MAX}$ or higher, the overerased cell detecting operation is terminated and processing returns to the erase operation shown in FIG. 3. On the other hand, when the column address is lower than the final address $CA_{MAX}$, processing proceeds to step S18. In step S18, the column address CA is incremented. As a result, when bit line BL0 is selected in the aforementioned step S11, bit line BL1 is selected. Then, processing returns to the aforementioned step S12, and the row address RA is returned to the initial value "0". Then, when bit line BL1 is selected in the aforementioned step S18, the threshold voltage Vt of a memory cell M01 positioned at the intersection of word line WL0 and bit line BL1 is verified.

Thus, every time the column address CA (=bit line BL number) is incremented by 1, a threshold voltage Vt of a memory cell M (RA, CA) is verified while the row address RA (=word line WL number) is successively incremented from "0" to "1024". Then, when the threshold voltages Vt of all the memory cells become 0.5 V or higher as a result of verification of the threshold voltages Vt of all the memory cells in the block, the overerased cell detecting operation is terminated. On the other hand, when a threshold voltage Vt of a memory cell M (RA, CA) is 0.5 V or lower to determine an overerased state, processing proceeds to step S19.

In step S19, an initial value "0" is set in the number N of times a software program is performed. In step S20, a row address RA when an overerased state is determined in the step S14 is stored in a register Xadd. Subsequently, software program processing is started.

The reason why the row address RA of an overerased memory cell is stored in register Xadd is as follows. When it is determined that a memory cell M (RA, CA) is in an overerased state, there are first and second cases. In the first case, the threshold voltage of the memory cell M (RA, CA) lowers too rapidly depending on the variation of an erase characteristic. In the second case, a cell current flows even into an unselected state and hence the threshold voltage of the memory cell M (RA, CA) is apparently detected as low because there exists a memory cell M having a negative threshold voltage among other memory cells M (RA+1, CA) to M (1023, CA) which share a bit line BL with the memory cell M (RA, CA). Therefore, a software program needs to be successively repeated for memory cells M (RA, CA) to M (1023, CA) connected to the same bit line BL a predetermined number of times until their threshold voltages become 0.5 or higher. For this management, the row address RA of the memory cell M (RA, CA) is stored in register Xadd.

In step S21, a write pulse (program pulse) is applied to a memory cell M (RA, CA) to execute a software program for raising a threshold voltage Vt. In step S22, the threshold voltage Vt of the memory cell M (RA, CA) is verified. In step S23, as a result of the above verification, it is judged whether the threshold voltage Vt of the memory cell M (RA, CA) is higher than 0.5 V. As a result, when the threshold voltage is higher than 0.5 V, it is determined that the memory cell M (RA, CA) is not in an overerased state, and processing returns to the aforementioned step S15 to continue the overerased cell detection processing. On the other hand, when the threshold voltage is 0.5 V or lower, processing proceeds to step S24.

In step S24, since the threshold voltage Vt is still 0.5 V or lower even though the software program is executed for the memory cell M (RA, CA), the row address RA is incremented. In step S25, it is judged whether the row address RA is the final address $RA_{MAX}$ or higher. As a result, when the row address is the final address $RA_{MAX}$ or higher, processing proceeds to step S26, and when the row address is lower than the final address $RA_{MAX}$, processing returns to the aforementioned step S21 and software program processing is performed for the next memory cell M (RA, CA).

Thus, while the row address RA (=word line WL number) is successively incremented from "RA" to "1024", software program processing is executed for the memory cell M (RA, CA) until the threshold voltage Vt becomes higher than 0.5 V. For example, when the threshold voltage Vt does not become higher than 0.5 V even though a software program is executed after it is determined that a threshold voltage Vt of memory cell M00 connected to WL0 is 0.5 V or lower, the software program is executed for WL1. In this case as well, processing shifts to the next row address when the threshold voltage Vt is 0.5 V or less. This operation is repeated up to WL1023.

In step S26, XADD, which is the content stored in register Xadd, is set in the row address RA. In step S27, the number N of times the software program is executed is incremented.

In step S28, it is judged whether the number N of times the software program is executed is "10" or more. As a result, when N is less than "10", processing returns to the aforementioned step S21 and shifts to the next software program processing. On the other hand, when N is "10" or more, the erase operation is terminated as an erase failure.

That is, for example, when it is determined that the threshold voltage Vt of memory cell M00 connected to word line WL0 is 0.5 V or lower, the software program processing is repeated up to 10 times for memory cells M00 to M (1023, 0) until their threshold voltages Vt become higher than 0.5 V.

Hereafter, a verify method for detecting a memory cell M in an overerased state will be explained, which method is used in the aforementioned step S14 or S23 in the overerased cell detecting operation. The simplest method will be explained with reference to FIGS. 16–18.

Here, as shown in FIG. 18, apart from memory cells (main cell) M in a memory cell array where data is actually written or read, there is provided a memory cell for reference (reference cell) Mr which has the same characteristic as that of main cells M and is used for verifying threshold voltages Vt of these main cells M. Furthermore, the threshold voltage Vt of a selected main cell M in the memory cell array is determined by comparing a cell current Ir flowing into this reference cell Mr and a cell current Im flowing into the selected main cell M.

First, the threshold voltage Vt of the reference cell Mr is set as, for example, 3.0 V in advance. Consequently, an I–V characteristic of this reference cell Mr is as shown in FIG. 17, which indicates that, when 4.5 V is applied to word line WLref connected to the control gate of the reference cell Mr, the cell current Ir flows into the reference cell Mr.

Meanwhile, as shown in FIG. 16, when 2 V is applied to word line WLmain (one of WL0 to WL1023) connected to the control gate of a main cell M selected to verify the threshold voltage Vt, the current Im flows into the main cell M as a cell current.

Here, since the main cell M and the reference cell Mr are memory cells having the same I–V characteristic. Therefore, when the threshold voltage Vt of the main cell M is 0.5 V, the same cell current as that of the reference cell Mr flows by a gate voltage of 2.0 V which is obtained by 1.5 V (gate voltage 4.5 V of Mr−threshold voltage Vt 3.0 V of Mr)+0.5 V (the threshold voltage Vt of M). That is, Im=Ir is obtained. However, when the threshold voltage Vt of the main cell M is higher than 0.5 V, the cell current Im flowing into the main cell M becomes lower than the cell current Ir flowing into the reference cell Mr (Im<Ir). On the contrary, when the threshold voltage Vt of the main cell M is lower than 0.5 V, the cell current Im becomes higher than the cell current Ir (Im>Ir). This is judged by a sense amplifier as shown in FIG. 18 to verify whether the cell is an overerased state.

That is, current values flowing into differential pairs in differential circuits constituting a sense amplifier change due to voltages generated in drains of the main cell M and the reference cell Mr by cell currents Im, Ir. Therefore, by comparing the amounts of the current values, it is judged whether the threshold voltage Vt of the main cell M is higher than a predetermined value (here, 0.5 V). That is, judgment is performed by current sense. In this case, an nMOS (metal oxide film semiconductor) transistor inserted between the differential pair and the ground potential becomes a constant current source, an operation point of the differential circuit is determined by a voltage bias inputted to the gate of the nMOS transistor.

The main cells M in the memory cell array are selected one by one and connected to the sense amplifier. Thereafter, 4.5 V is applied to the word line WLref of the reference cell Mr, while 2 V is applied to the word line WLmain of the selected main cell M. Thereby, it is successively verified whether the cell is in an overerased state.

However, the conventional verify method for detecting a memory cell M in an overerased state has the following problems. In the conventional overerase verify method, as described above, the main cells M are verified one by one. However, actually, 8 main cells M whose control gates are connected to one word line are verified in parallel. Since verify time of one block is expressed by (verify time of 1 memory cell M)×(number of memory cells in a block)/(number of cells processed in parallel), when 500 ns is required to verify one memory cell M, the verify time of one block in this case is (500 ns×512×1024)/8−33 ms.

As shown in the algorithm of the overerased cell detecting operation shown in FIG. 15, this verify time is time required for a normal detection routine performed in steps S11 to S18 in FIG. 15. Therefore, when a memory cell M in an overerased state is detected and consequently a software program is executed, a software program time and verify time which the software program involves are further added to the verify time of 33 ms.

In an erase operation, as described above, erase-verify and erase pulse application are alternately repeated in erase-verify performed in the step S4 as shown in FIG. 3 so that threshold voltages of all memory cells M in a block become a predetermined voltage (3.0 V in FIG. 13) or lower. Furthermore, a variation in the erase characteristic of each memory cell M is not so actually wide as arises a problem. Therefore, in a normal condition, a memory cell in an overerased state rarely appears.

However, due to severe use environment of memory cells or a change thereof with time, a memory cell in an overerased state appears, so that a normal operation of a device cannot be performed. This allows no omittance of the algorithm for detection of an overerased cell and recovery of a threshold voltage in an erase operation so as to guarantee a normal operation of the device.

In addition, the overerase detection time needs to be shortened because it is supposed that high-speed erase whose erase time is, for example, 10 ms or less is required.

SUMMARY OF THE INVENTION

An object of the present invention is to provide a nonvolatile semiconductor memory device with which time of overerased cell detection essential for guarantee of reliability can be largely shortened in consideration to the present situation where an overerased cell rarely appears in a normal state.

An object of the present invention is to provide a method of detecting such an overerased cell as the above.

To achieve the above object, a first aspect of the present invention provides a nonvolatile semiconductor memory device comprising:

a memory cell array including:
a plurality of floating gate electric field effect transistors arranged in a matrix, each having a control gate, a drain and a source and being capable of electrically writing and erasing information, wherein a threshold voltage of each of the floating gate electric field effect transistors in a written state is higher than a threshold voltage of each of the floating gate electric field effect transistors in an erased state, a plurality of row lines connected to control gates of the floating gate electric field effect transistors arranged in a row direction, a plurality of column lines connected to drains of the floating gate electric field effect transistors arranged in a column direction, and a common line commonly connected to sources of the floating gate electric field effect transistors constituting a block; and a erase processing means which performs erase processing where, by controlling voltages applied to the row lines, the column lines and the common wiring, firstly write before erase is performed, secondly write-verify before erase is performed, thirdly an erase pulse is applied, fourthly verify after erase pulse application is performed, fifthly first verify is performed to detect an overerased cell, sixthly, when an overerased cell is detected in the first verify by applying a voltage to one of the row lines, second verify is performed to specify the overerased cell by applying a voltage different from the voltage applied in the first verify to the row line, and seventhly, when the overerased cell is specified as a result of the second verify, write of a software program is performed for the overerased cell.

According to the above configuration, when erase processing is performed by the erase processing means, verify is performed after erase pulse application and then a first verify for detecting an overerased cell is performed. When an overerased cell is detected by this first verify, a second verify for specifying the overerased cell is performed. In this case, at the time of the second verify, a voltage different from the voltage applied to a row line at the time of the first verify is applied to the row line. Therefore, by lowering the voltage applied to the row line at the time of the first verify to the level of the threshold voltage in a floating gate electric field effect transistor to be an overerased cell, the first verify of a plurality of floating gate electric field effect transistors can be performed in a batch with low currents. On the other hand, by making the voltage applied to the row line at the time of the second verify higher than at the time of the first verify, detection sensitivity is increased and hence specific speed of the overerased cell can be increased.

Furthermore, in one embodiment of the present invention, the erase processing means has the first verify means which performs the first verify in units of the column lines by applying a voltage to all row lines connected to control gates of the plurality of floating gate electric field effect transistors whose drains are commonly connected to the column line so that one floating gate electric field effect transistor in an overerased state at most exists among the plurality of floating gate electric field effect transistors, and that a leakage current when the floating gate electric field effect transistor in an overerased state is unselected in a normal operation can be equal to a predetermined value or lower.

According to this embodiment, since the first verify is performed in units of the column lines, the number of times of verify is reduced in comparison with the case that the first verify is performed in units of individual floating gate electric field effect transistors. Therefore, the overerased cell detection time is shortened. At this time, the voltage applied to the row line is set so that there exists one floating gate electric field effect transistor in an overerased state at most, and that a leakage current when this floating gate electric field effect transistor in an overerased state is unselected is equal to a predetermined value or lower in a normal operation, and therefore, lower power consumption can be achieved.

A second aspect of the present invention provides a method of detecting an overerased cell in the nonvolatile semiconductor memory device according to the firs aspect of the invention, wherein pass or failure is determined at time of the first verify and the second verify by comparing a current value of the column line connected to a drain of a reference cell and a current value of the column line connected to a drain of a target cell composed of a floating gate electric field effect transistor to be verified, the reference cell being composed of a floating gate electric field effect transistor which has the same structure as that of the aforementioned floating gate electric field effect transistor and is not written or erased.

According to the above configuration, the first verify and the second verify are performed by current sense using the reference cell. Therefore, a current value flowing into a target cell constituted by the floating gate electric field effect transistor to be verified can be directly detected. Therefore, for example, the first verify for a plurality of target cells whose drains are commonly connected to the column line can be performed in a batch.

Furthermore, in one embodiment of the present invention, the first verify and the second verify are performed by using the same reference cell.

According to this embodiment, the number of the reference cells is reduced to half, and expansion of the chip area is prevented. Furthermore, since current sense characteristics become the same at the time of the first verify and the second verify, there are less errors in detection of an overerased cell.

Furthermore, in one embodiment of the present invention, a first voltage is lower than a second voltage, a third voltage is lower than a fourth voltage, and the first voltage is lower than the third voltage, where a voltage applied to a row line connected to a control gate of the target cell at time of the first verify is defined as the first voltage, a voltage applied to a row line connected to a control gate of the reference cell at time of first verify is defined as the second voltage, a voltage applied to the row line connected to the control gate of the target cell at time of the second verify is defined as the third voltage, and a voltage applied to the row line connected to the control gate of the reference cell at time of the second verify is defined as the fourth voltage.

According to this embodiment, at the time of the first verify and second verify, the voltage applied to the row line on the reference cell side is higher than the voltage applied to the row line on the target cell side. Therefore, the state of the reference cell becomes stable, and detection accuracy is improved. Furthermore, the voltage applied to the row line on the target cell side at the time of the second verify is higher than the voltage applied to the row line on the target cell side at the time of the first verify. Therefore, sense sensitivity at the time of the second verify becomes higher than that of the first verify.

Furthermore, in one embodiment of the present invention, current values in the reference cell and the target cell are compared by a sense amplifier, and at time of the first verify, a predetermined voltage for detecting an overerased cell is applied to all the row lines in the block, while the column lines are successively selected and connected to the sense amplifier to detect the overerased cell in units of the column lines.

According to this embodiment, the first verify is performed in units of the column lines. Therefore, the number of times of verify is reduced in comparison with the case that the first verify is performed in units of individual floating gate electric field effect transistors, and hence the overerased cell detection time is shortened.

Furthermore, in one embodiment of the present invention, at time of the second verify, a voltage different from the voltage applied to the row lines at time of the first verify is successively applied to the row lines, and only a column line determined as including an overerased cell at time of the first verify is connected to the sense amplifier so as to specify the overerased cell in units of individual target cells.

According to this embodiment, the overerased cell is specified in units of individual target cells for a column line for which presence of an overerased cell is determined at the time of the first verify. Therefore, the overerased cell is precisely specified.

Furthermore, one embodiment of the present invention, the floating gate electric field effect transistor having a threshold voltage between 0 and 1 V inclusive in the memory cell array is detected as the overerased cell at time of the first verify and the second verify.

According to this embodiment, a floating gate electric field effect transistor having a threshold voltage between 0 V and 1 V inclusive is detected as the overerased cell. Therefore, the maximum value of a leakage current in a normal operation when detection omission occurs is restricted to the leakage current of a floating gate electric field effect transistor having a threshold voltage of 0 V. Furthermore, a small number of overerased cells positioned in the vicinity of the lower limit in distribution of threshold voltages of all the floating gate electric field effect transistors belonging to the memory cell array can be detected.

A third aspect of the invention provides a method of detecting an overerased cell in the nonvolatile semiconductor memory device according to the first aspect of the invention, wherein pass or failure at time of the first verify is determined based on a voltage value of the column line connected to the drain of a target cell composed of a floating gate electric field effect transistor to be verified, and pass or failure at time of the second verify is determined by comparing a current value of the column line connected to the drain of a reference cell and a current value of the column line connected to the drain of the target cell, the reference cell being composed of a floating gate electric field effect transistor which has the same structure as that of the aforementioned floating gate electric field effect transistor and is not written or erased.

According to the above configuration, the first verify is performed by voltage sense. Therefore, an overerased cell can be detected with favorable sensitivity in a short time.

Furthermore, in one embodiment of the present invention, a voltage between 0 and 1 V inclusive is applied to the row line connected to the control gate of the target cell at time of first verify.

According to this embodiment, a floating gate electric field effect transistor having a threshold voltage of between 0 V and 1 V inclusive is detected as the overerased cell. Therefore, the maximum value of a leakage current in a normal operation when detection omission occurs is restricted to the leakage current of a floating gate electric field effect transistor having a threshold voltage of 0 V. Furthermore, a small number of overerased cells positioned in the vicinity of the lower limit in distribution of threshold voltages of all the floating gate electric field effect transistors belonging to the memory cell array can be detected.

Furthermore, in one embodiment of the present invention, a voltage of a column line connected to the target cell is detected by a sense amplifier at time of the first verify, and a leakage current to be detected is controlled by controlling time when the column line connected to the drain of the target cell is connected to the sense amplifier.

According to this embodiment, by making time sufficiently long when the column line connected to the drain of the target cell is connected to the sense amplifier, a leakage current in a normal operation is sufficiently lowered.

Furthermore, in one embodiment of the present invention, a sixth voltage is lower than a seventh voltage, where a voltage applied to a row line connected to the control gate of the target cell at time of the first verify is defined as a fifth voltage, a voltage applied to the row line connected to the control gate of the target cell at time of second verify is defined as the sixth voltage, and a voltage applied to a row line connected to the control gate of the reference cell at time of the second verify is defined as the seventh voltage.

According to this embodiment, the voltage applied to the row line on the reference cell side at the time of the second verify is higher than the voltage applied to the row line on the target cell side. Therefore, the state of the reference cell becomes stable, and detection precision is improved.

Furthermore, in one embodiment of the present invention, a voltage value of the column line connected to the target cell is detected by a first sense amplifier, and at time of the first verify, a predetermined voltage for detecting an overerased cell is applied to all the row lines in the block, and the column lines are successively selected to be connected to the first sense amplifier so as to detect the overerased cell in units of the column lines.

According to this embodiment, the first verify is performed in units of the column lines. Therefore, the number of times of verify is reduced in comparison with the case that the first verify is performed in units of individual floating gate electric field effect transistors, and therefore, the overerased cell detection time is shortened.

Furthermore, in one embodiment of the present invention, current values in the reference cell and the target cell are compared by a second sense amplifier at time of the second verify, and at time of the second verify, a voltage different from the voltage applied to the row line at time of the first verify is successively applied at time of the second verify, and only column lines determined as including an overerased cell at time of the first verify are successively connected to the second sense amplifier so as to specify the overerased cells in units of individual target cells.

According to this embodiment, the overerased cell is specified in units of individual target cells for a column line in which presence of an overerased cell is determined at the time of the first verify. Therefore, the overerased cell is precisely specified.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereafter, embodiments of the present invention will be explained in detail with reference to the accompanying drawings.

First Embodiment

Figure 1:
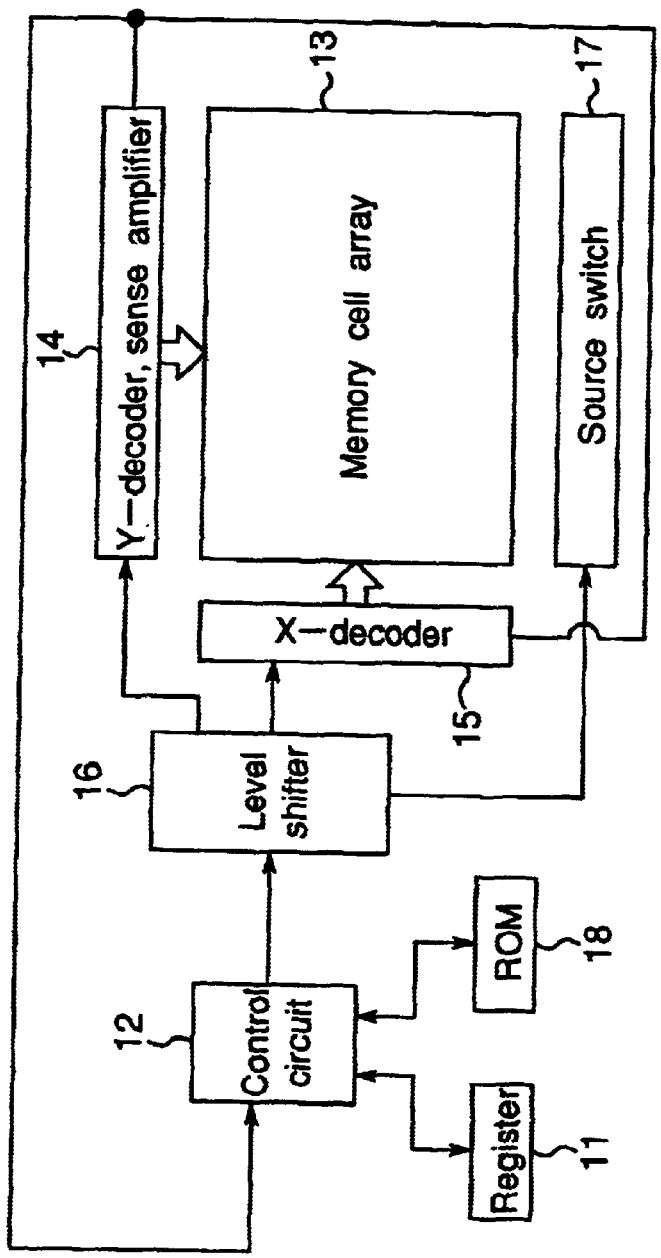
FIG. 1 is a schematic block diagram showing a nonvolatile semiconductor memory device according to the present invention.

FIG. 1 is a block diagram showing a configuration of a nonvolatile semiconductor memory device according to a first embodiment of the present invention. In this nonvolatile semiconductor memory device, a register 11 stores a row address when a software program is performed in an erase operation as described later. Reference numeral 13 denotes a memory cell array. Reference numeral 14 denotes a source driver on which a Y decoder and a sense amplifier are mounted. The Y decoder includes a drive circuit for receiving a control signal from a control circuit 12 so as to apply a voltage to each bit line. The sense amplifier is connected to each bit line. Reference numeral 15 denotes a gate driver on which an X decoder is mounted. The X decoder includes a drive circuit for receiving a control signal from the control circuit 12 so as to apply a voltage to each word line. Reference numeral 16 denotes a level shifter. The level shifter level-converts the control signal from the control circuit 12 to a voltage for write, erase or read and thereafter outputs the voltage. Reference numeral 17 denotes a source switch is for selecting a common source line. Reference numeral 18 denotes a ROM (Read Only Memory) in which programs for write processing, erase processing and read processing and so forth by the control circuit 12 are stored.

Figure 2:
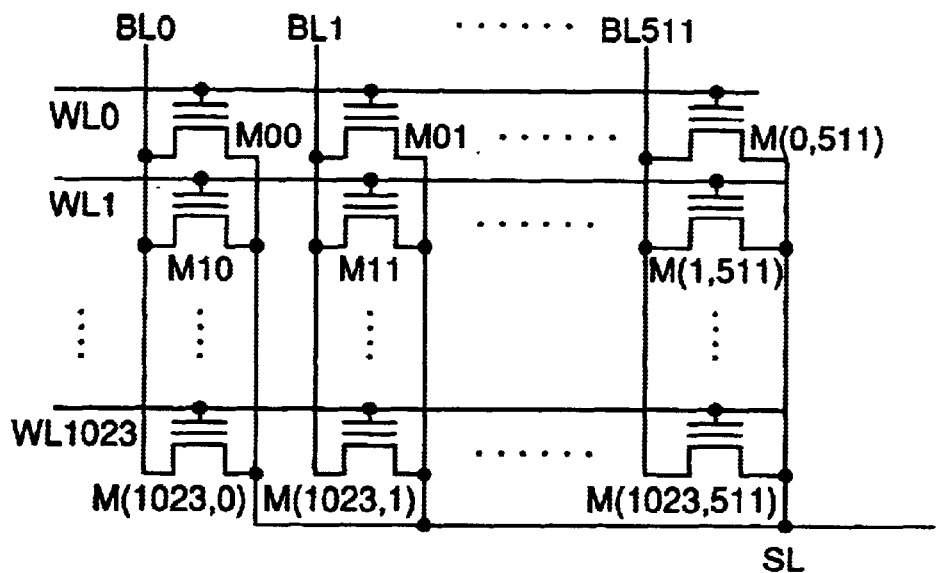
FIG. 2 shows a specific configuration of a memory cell array in FIG. 1.

FIG. 2 shows a configuration of the memory cell array 13 in the nonvolatile semiconductor memory device shown in FIG. 1. The configuration of the memory cell array 13 is a flash memory having the same configuration as that of the conventional memory cell array.

Figure 3:
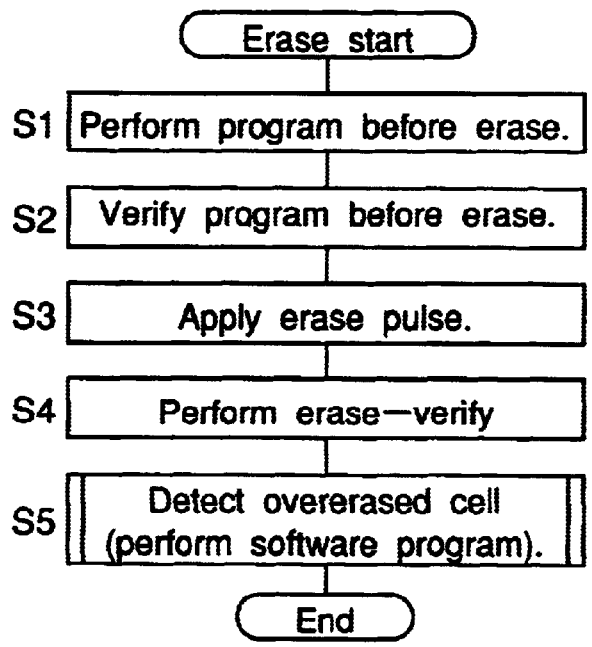
FIG. 3 is a flow chart of an erase operation.

FIG. 3 is a flow chart showing an algorithm for an erase operation by an erase processing program stored in the ROM 18. This erase operation is performed in the order of a before-erase program, verify of the before-erase program, erase pulse application, erase-verify and overerased cell detection. Among these, the verify of the before-erase program, erase pulse application and erase-verify are performed in the same manner as in the case of the above-described conventional erase operation. The algorithm about the overerased cell detection processing is different from the conventional one.

That is to say, an erase processing means in a first aspect of the invention is configured by steps S1 to S5 in the erase operation shown in FIG. 3 using the control circuit 12, level shifter 16, source driver 14, gate driver 15 and source switch 17.

Figure 13:
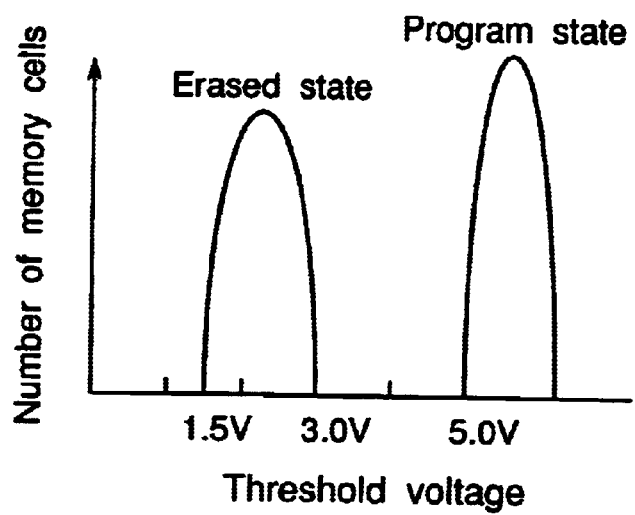
FIG. 13 shows threshold voltage distributions in a written state and an erased state.
Figure 14:
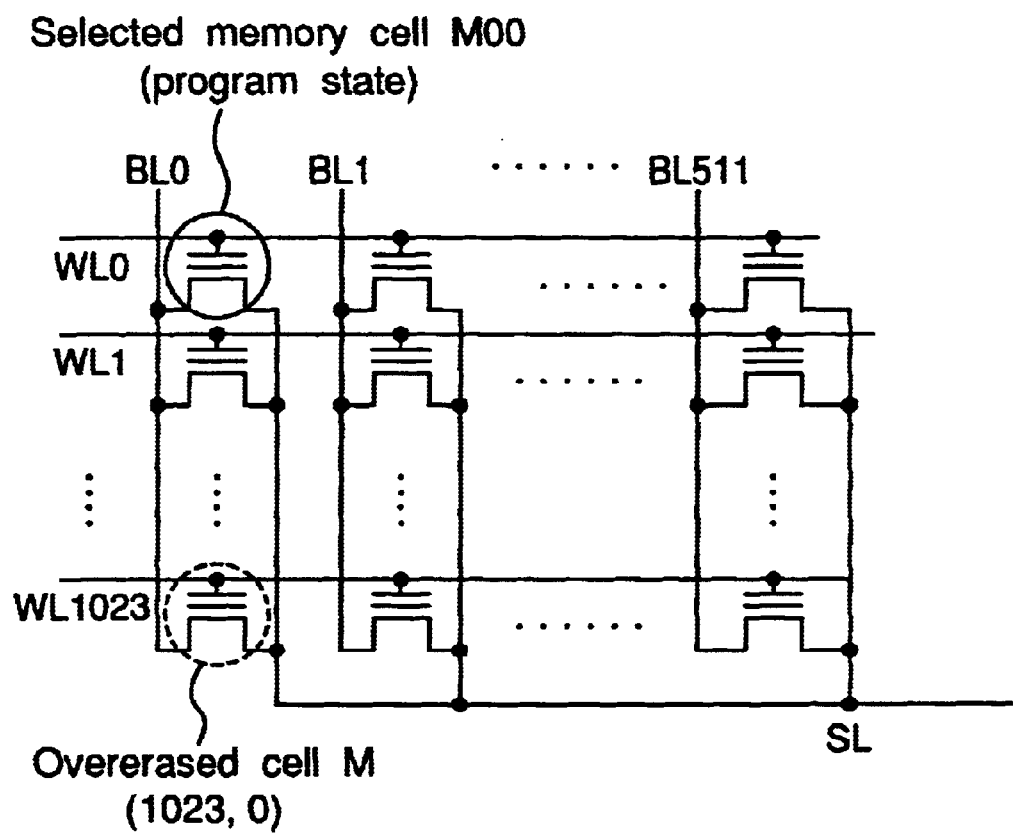
FIG. 14 is a view for explaining the reason why a precise verify operation cannot be performed due to presence of an overerased cell.
Figure 15:
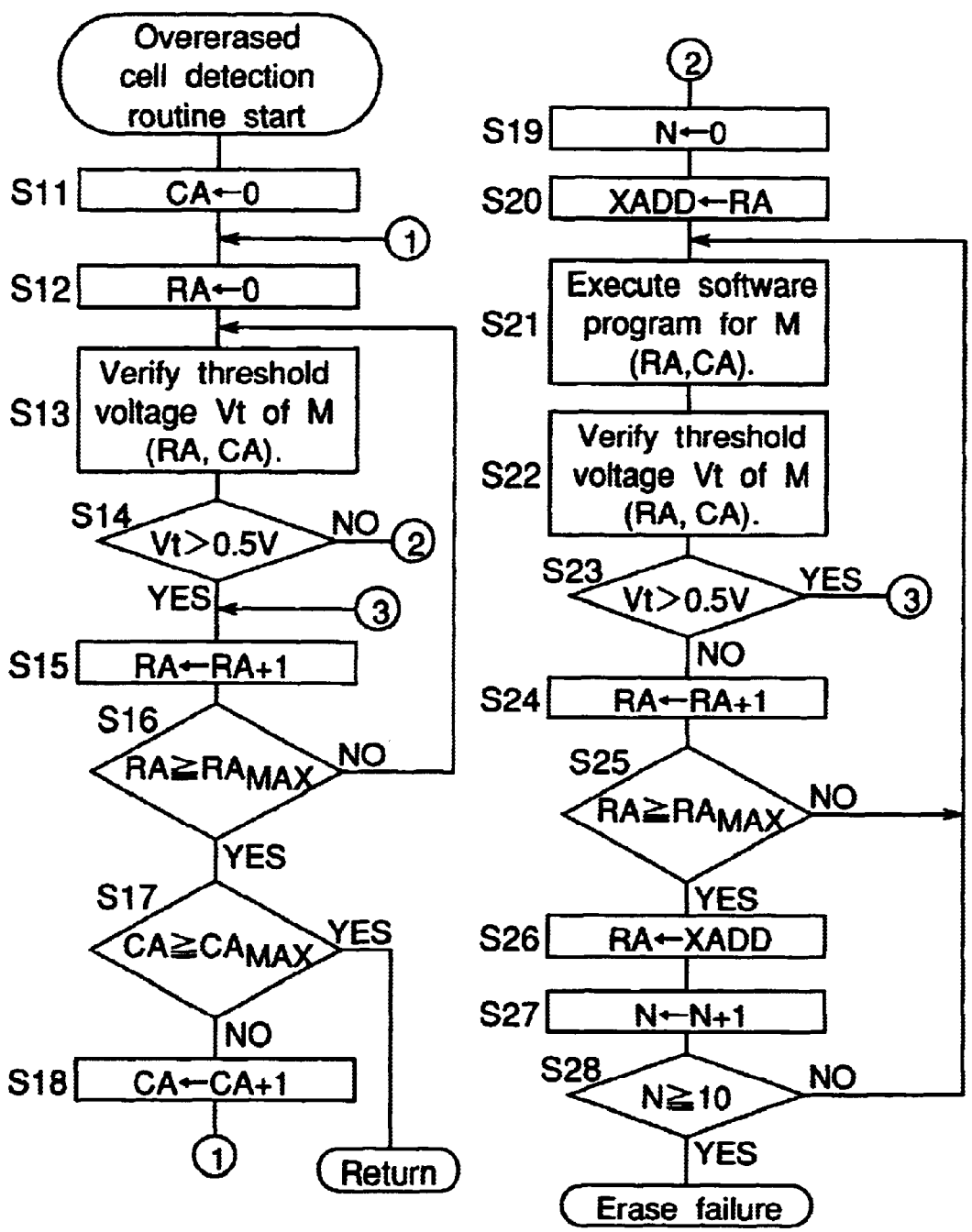
FIG. 15 is a flow chart of a conventional overerased cell detecting operation.

As described above, in erase-verify in step S4 in the erase operation shown in FIG. 3, erase-verify and erase pulse application are alternately repeated so that threshold voltages Vt of all memory cells in a block to be erased are made equal to a predetermined voltage (3.0 V in FIG. 13) or lower.

Figure 4:
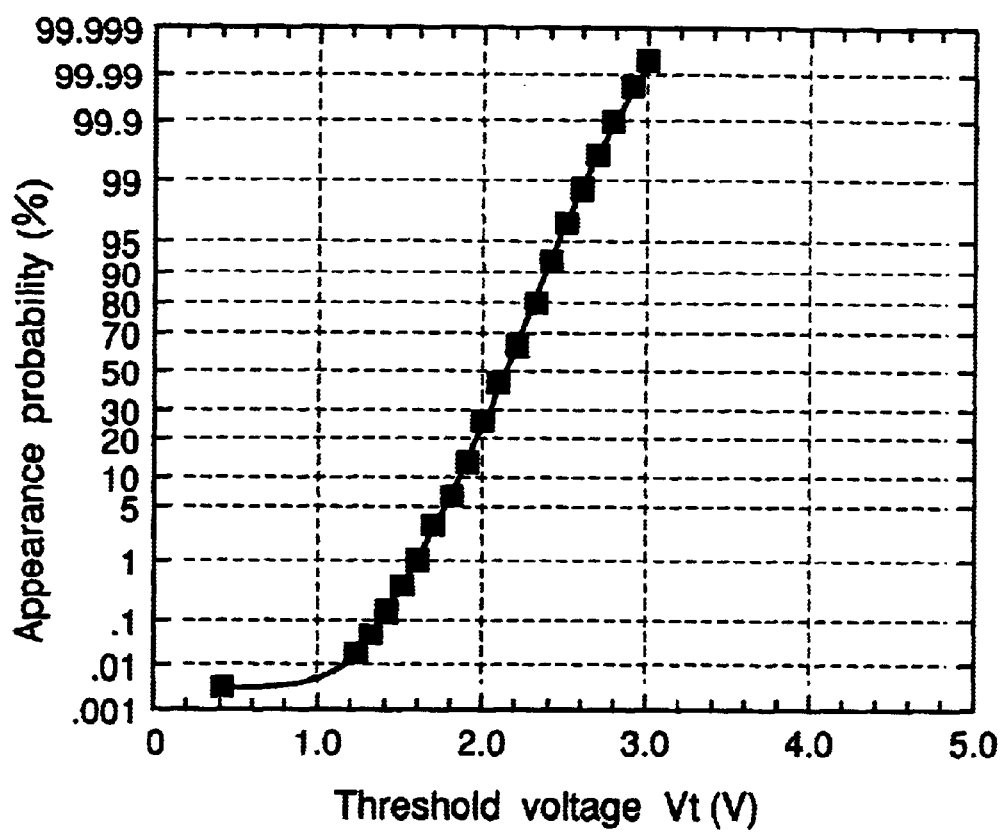
FIG. 4 shows distribution of threshold voltages Vt of all memory cells at a termination point of erase-verify in the erase operation shown in FIG. 3.
Figure 6:
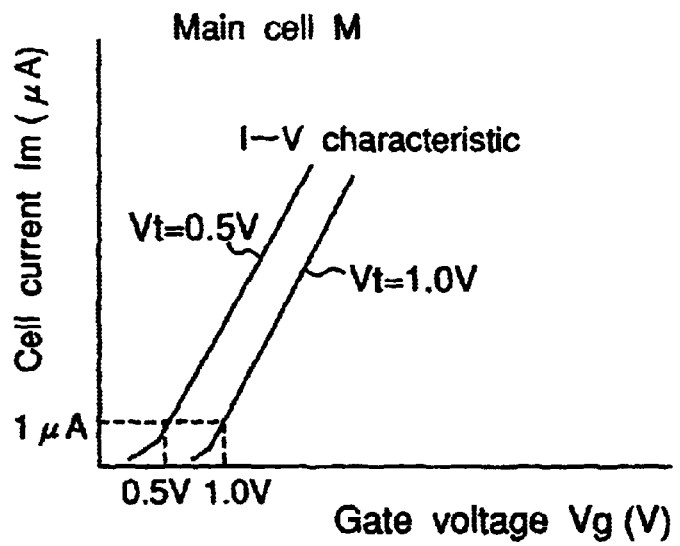
FIG. 6 shows an I–V characteristic of a main cell.

FIG. 4 shows a distribution state of the threshold voltages Vt of all memory cells in the block at this point. The horizontal axis represents the threshold voltage Vt (V) of a memory cell, and the vertical axis represents appearance probability (%) of the memory cell. FIG. 4 shows that 99.99% of threshold voltages Vt of all memory cells are 1.0 V or higher, and the appearance probability of a memory cell having a threshold voltage Vt of 0.5 V or less is about 0.005% at most. Here, FIG. 6 shows an I–V characteristic of a main memory M in the block. As shown in FIG. 6, when 0.5 V is applied to word line WLmain of the main memory M, a cell current Im which flows into a main memory M having a threshold voltage Vt of 1.0 V becomes substantially 0, while a cell current Im of a main memory M having a threshold voltage Vt of 0.5 V becomes 1 $\mu$A. In consideration to such a situation, in the next step S5, an overerased cell (whose threshold voltage Vt is 0.5 V or lower) detecting operation is performed.

Figure 5:
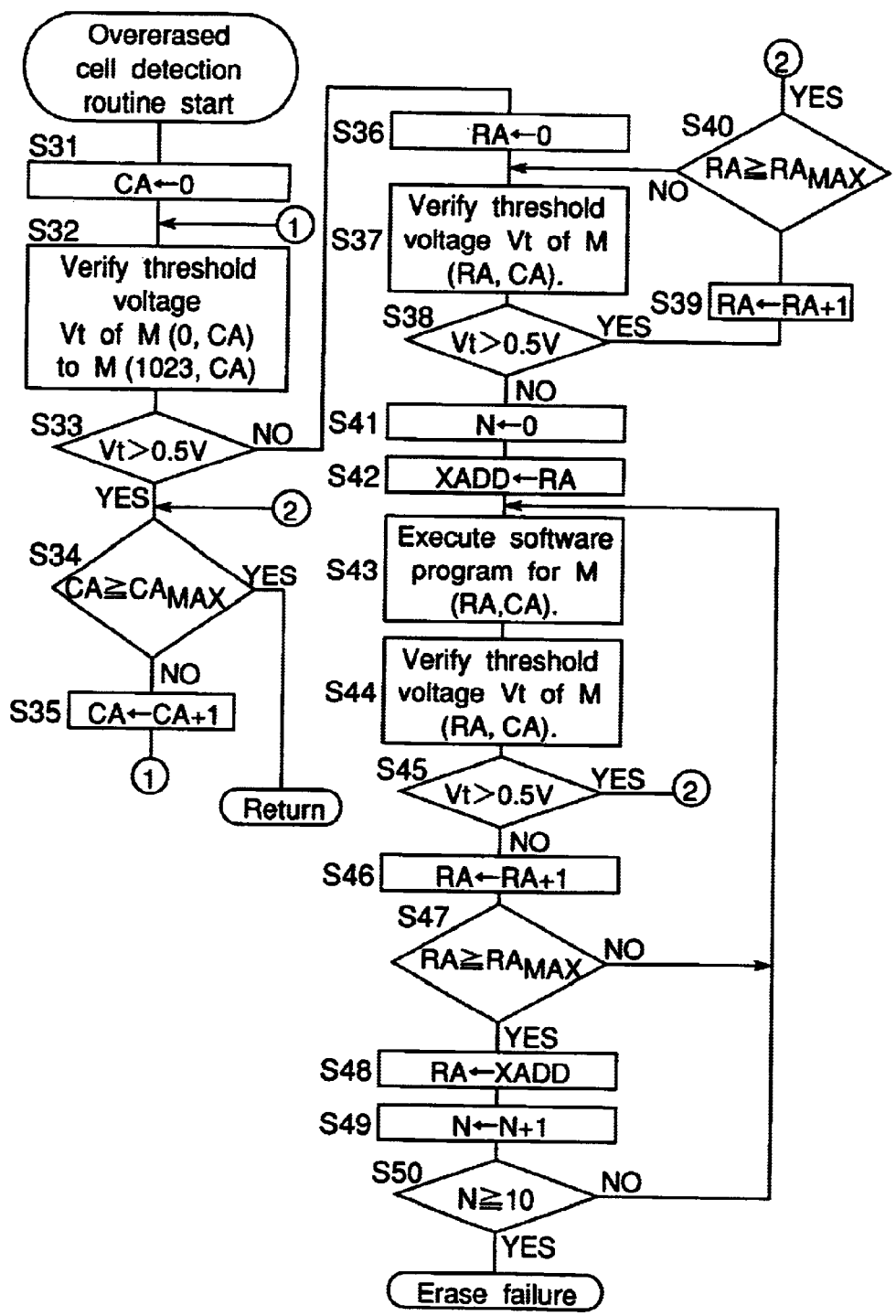
FIG. 5 is a flow chart of an overerased cell detecting operation.

FIG. 5 is a flow chart of an overerased cell detecting operation performed in step S5 in the flow chart of the erase operation shown in FIG. 3. Hereafter, an overerased cell detecting operation of this embodiment will be explained with reference to the flow chart shown in FIG. 5 and the configuration of the memory cell array shown in FIG. 2.

In step S31, first, an initial value "0" is set in column address CA (=bit line BL number). In step S32, threshold voltages Vt of memory cells M (0, CA) to M (1023, CA) positioned at this column address CA are verified in a batch. In step S33, as a result of this verification, it is judged whether the threshold voltages Vt of the memory cells M (0, CA) to M (1023, CA) are higher than 0.5 V. As a result, when the threshold voltages are higher than 0.5 V, it is determined that the memory cells M (0, CA) to M (1023, CA) are not in an overerased state, and processing proceeds to step S34. On the other hand, when the threshold voltages are 0.5 V or lower, it is determined that there is an overerased cell among the memory cells M (0, CA) to M (1023, CA), and proceeding proceeds to step S36.

Figure 7:
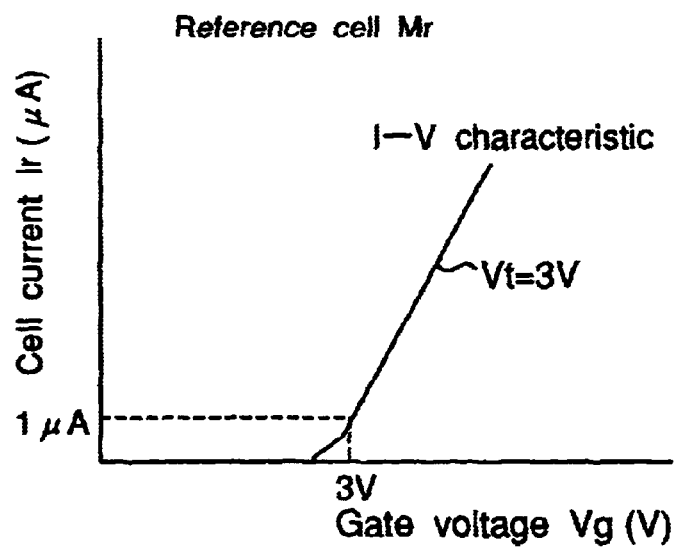
FIG. 7 shows an I–V characteristic of a reference cell.

Thus, in this embodiment, overerase-verify is performed for each bit line BL. For example, cell currents flowing into 1024 memory cells from memory cells M00 to M (1023, 0) are detected by bit line BL0. In this case, as shown in the I–V characteristic in FIG. 7, the threshold voltage Vt of a reference cell Mr is set as 3.0 V in advance, the reference cell Mr being provided separately from cells to which data is written or read. Furthermore, the cell current Ir is about 1 µA when the threshold voltage Vt of 3 V is applied to the gate electrode.

Figure 9:
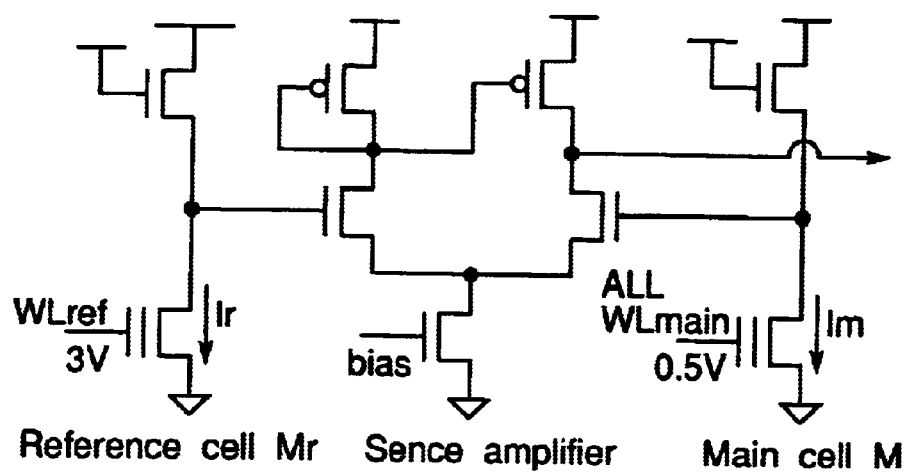
FIG. 9 is a circuit diagram of a sense amplifier for performing current detection by current sense.
Figure 18:
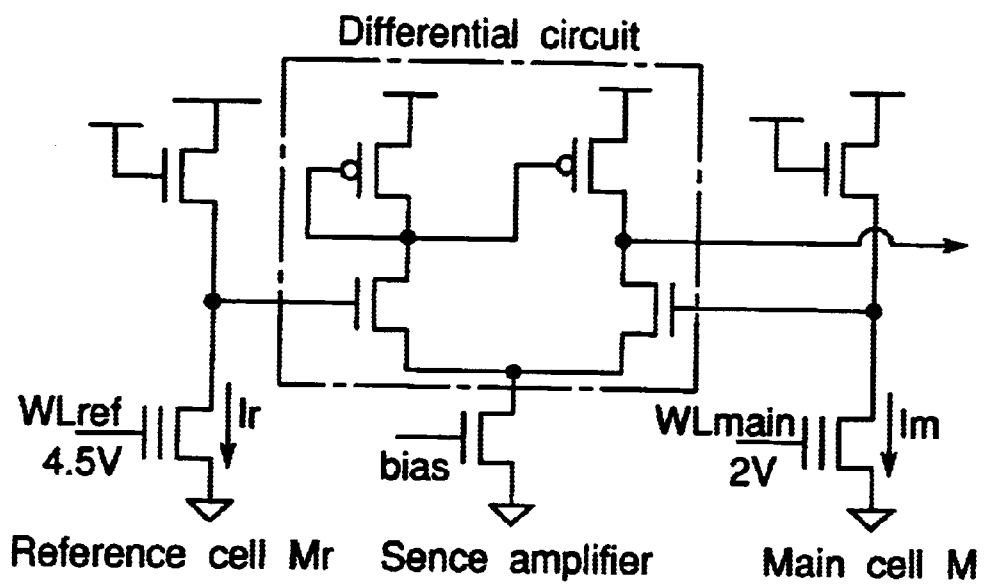
FIG. 18 is a circuit diagram of a sense amplifier for performing current detection by current sense at the time of overerased cell detection.

Furthermore, when the threshold voltage Vt is verified, 0.5 V is applied to all word lines WL (WL0 to WL1023 in FIG. 2) connected to control gates of main cells M (0, CA) to M (1023, CA) to be verified as shown in FIG. 9. Meanwhile, 3.0 V is applied to word line WLref of the control gate of the reference cell Mr. Then, current sense is performed by a sense amplifier (same sense amplifier as shown in FIG. 18, but its applied voltage is different).

As a result, when cell currents (currents of 1024 main cells M) Im flowing into main cells M (1024 main cells M) for 1 bit are higher than the cell current Ir=1 µA flowing into the reference cell Mr, it is determined that an overerased cell exists among these main cells M for 1 bit. On the other hand, when the cell currents (currents of 1024 main cells M) Im are 1 µA or lower, it is determined that no overerased cell exists among these main cells M for 1 bit.

The voltage applied to word lines WL0 to WL1023 corresponding to the main cells M (0, CA) to M (1023, CA) is thus reduced from the conventional 2 V (see FIG. 18) to 0.5 V so that a cell current Im is set to be small (about 1 µA). This reduction of voltage results from consideration of appearance probability of a memory cell M having a threshold voltage Vt of 1.0 V or lower as shown in FIG. 4.

In other words, when the main cell M has a threshold voltage Vt of 0.5 V or less, appearance probability of a main cell M is 0.005% or less. This probability means existence of one or no cell among 1024 main cells M connected to one bit line BL. Furthermore, when a threshold voltage Vt is 1.0 V, appearance probability of the main cell M is about 0.01%. This probability means existence of 0.1 cell (=1024 cells× 0.01/100) among 1024 main cells M per bit line BL, which also means existence of one or no cell.

Thus, by setting such a threshold voltage Vt as the above as a voltage for judging an overerased cell, one overerased cell at the most exists among 1024 main cells M even when it is determined that overerased cells exist among main cells per bit as described above.

In step S34, it is judged whether the column address CA is higher than the final address $CA_{MAX}$ (=512). As a result, when the column address is higher than the final address $CA_{MAX}$, the overerased cell detecting operation is terminated, and processing returns to the erase operation shown in FIG. 3. On the other hand, when the column address is lower than the final address $CA_{MAX}$, processing proceeds to step S35.

In step S35, the column address CA is incremented. Then, processing returns to the aforementioned step S32, and threshold voltages Vt of all main cells M connected to the next bit line BL are verified.

In this case, a voltage of 0.5 V is applied to all word lines WL0 to WL1023 in the block and 3.0 V is also applied to word line WLref of the reference cell Mr as they are. Furthermore, for example, cell currents (currents of 1024 main cells M) Im flowing into bit line BL1 and a cell current Ir (=1 µA) flowing in the reference cell Mr are compared by the aforementioned sense amplifier. Thereafter, similarly, each time it is determined that no overerased cell is included among main cells M for each bit line, judgment is successively continued for bit lines BL2, BL3, . . . , BL511 while the column address CA is incremented. Then, when there is no overerased cell, overerase-verify is terminated, and the erase processing operation is terminated.

That is, the first verify means in a second aspect of the invention is constituted by steps S31 to S35 in the overerased cell detecting operation shown in FIG. 5.

Figure 8:
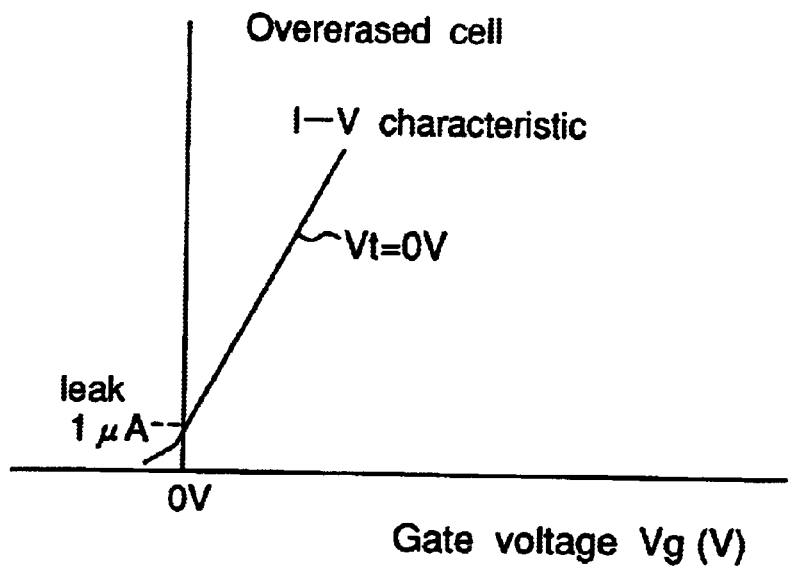
FIG. 8 shows an I–V characteristic of an overerased cell having a threshold voltage Vt of 0 V.

When overerase-verify is performed with such a low current (1 µA), the following advantages are obtained. That is, for example, it is assumed that even though it is determined that no overerased cell exists since the cell currents (currents of 1024 main cells M) Im are close to 1 µA or lower, there is actually one memory cell M having a threshold voltage Vt close to 0 V. Even in this case, an I–V characteristic of a memory cell M having a threshold voltage Vt of 0 V is as shown in FIG. 8 (the I–V characteristic curve is moved to the low voltage side by 0.5 V when the threshold voltage Vt shown in FIG. 6 is 0.5 V). Therefore, a leakage current when the memory cell M is unselected (0 V is applied to a word line) at the time of write-verify, erase-verify or read in a normal operation is suppressed to 1 µA or lower. That is, a device having a very low leakage current can also be selected.

In the overerase-verify method of this embodiment, since a low current of about 1 µA is detected for each bit line BL to judge the relationship of the current values, a current needs to be stabilized or sense sensitivity needs to be increased. Therefore, one overerase-verify time is 1 µs, which is longer than that (500 ns) of the conventional case where judgment is performed for each memory cell M. However, since verify in this embodiment is performed in a batch in units of bit lines BL, the total overerase-verify time becomes $$1\,\mu s \times 512 = 512\,\mu s$$

This is much shorter than conventional one.

Furthermore, as in the case of the conventional case, when 1 block has 64 kB, overerase-verify is performed for 8 cells (8 bits) in parallel, and one overerase-verify time is 1 µs, verify time becomes $$1\,\mu s \times 512 \div 8 = 64\,\mu s$$

Therefore, the verify time of this embodiment is largely shortened in comparison with the verify time of 3.3 ms in the conventional case where overerase-verify is performed in units of memory cells M. That is to say, time of a normal detection routine (steps S31 to S35) in an overerased cell detection is largely shortened in this embodiment.

Thus, even when 1 block has 64 kB, and overerase-verify is performed for 8 cells (8 bits) in parallel, the number of overerased cells is about 0.005%×1024×8=0.4, which is still probability in which one or no such cell appears. On the other hand, when the number of memory cells (cell current is almost 0 when 0.5 V is applied to word line WL) having a threshold voltage Vt of 1.0 V is 0.01%×1024×8=0.8, which also means probability in which one or no such cell appears.

When it is determined that the threshold voltage Vt is 0.5 V or lower in the step S33 as described above, it is determined that an overerased cell exists among memory cells M (0, CA) to M (1023, CA), so that proceeding proceeds to step S36. In step S36, an initial value "0" is set in a row address RA. In step S37, the threshold voltage Vt of a memory cell M (RA, CA) is verified. In step S38, as a result of this verification, it is judged whether the threshold voltage Vt of the memory cell M (RA, CA) is higher than 0.5 V. As a result, when the threshold voltage is higher than 0.5 V, it is determined that the memory cell M (RA, CA) is not in an overerased state, and processing proceeds to step S39. On the other hand, when the threshold voltage is 0.5 V or lower, it is determined that the memory cell M (RA, CA) is in an overerased state, and proceeding proceeds to step S41. In step S39, the row address RA is incremented. In step S40, it is judged whether the row address RA is higher than the final address $RA_{MAX}$ (=1024). As a result, when the row address is higher than the final address $RA_{MAX}$, proceeding returns to the aforementioned step S34, and detection processing of an overerased cell for the next column address (the next bit line BL) is continued. On the other hand, when the row address is lower than the final address $RA_{MAX}$, processing returns to the aforementioned step S37, and the threshold voltage Vt of the next memory cell M (RA, CA) is verified.

In step S41, an initial value "0" is set in the number N of times a software program is executed. In step S42, the row address RA when the overerased state is determined in the aforementioned step S38 is stored in the register (XADD) 11. In step S43, the software program is executed for the memory cell M (RA, CA). Here, as voltages of the software program, a gate voltage Vg and a drain voltage are 5 V and 6 V, respectively. In step S44, the threshold voltage Vt of the memory cell M (RA, CA) is verified. In step S45, as a result of the verification, it is judged whether the threshold voltage Vt of the memory cell M (RA, CA) is higher than 0.5 V. As a result, when the threshold voltage is higher than 0.5 V, the threshold voltage Vt of the memory cell M (RA, CA) is increased by the software program, and it is determined that the cell is not in an overerased state any longer. Then, processing returns to the aforementioned step S34, and overerased cell detection processing is continued. On the other hand, when the threshold voltage is 0.5 V or lower, processing proceeds to step S46.

In step S46, the row address RA is incremented. In step S47, it is judged whether the row address RA is equal to the final address $RA_{MAX}$ (=1024) or higher. When the row address is equal to the final address $RA_{MAX}$ or higher, processing proceeds to step S48. When the row address is lower than the final address $RA_{MAX}$, processing returns to the aforementioned step S43 and software program processing is performed for the next memory cell M (RA, CA). Thus, while the row address RA (=word line WL number) is successively incremented, the software program processing is performed for the memory cell M (RA, CA) until its threshold voltage Vt becomes higher than 0.5 V.

In step S48, XADD, which is the content stored in the register 11, is set in the row address RA. In step S49, the number N of times the software program is executed is incremented. In step S50, it is judged whether the number N of times the software program is executed is "10" or more. When N is less than "10", processing returns to the aforementioned step S43, and the next software program processing is performed. On the other hand, when N is "10" or more, erase failure is determined, and the erase operation is terminated.

Here, in the case of the erase failure, erase failure is stored in the register, and finally it is separately judged whether this small block in units of bits is replaced with another small block in units of bits, the device itself is not used, or the like.

Figure 16:
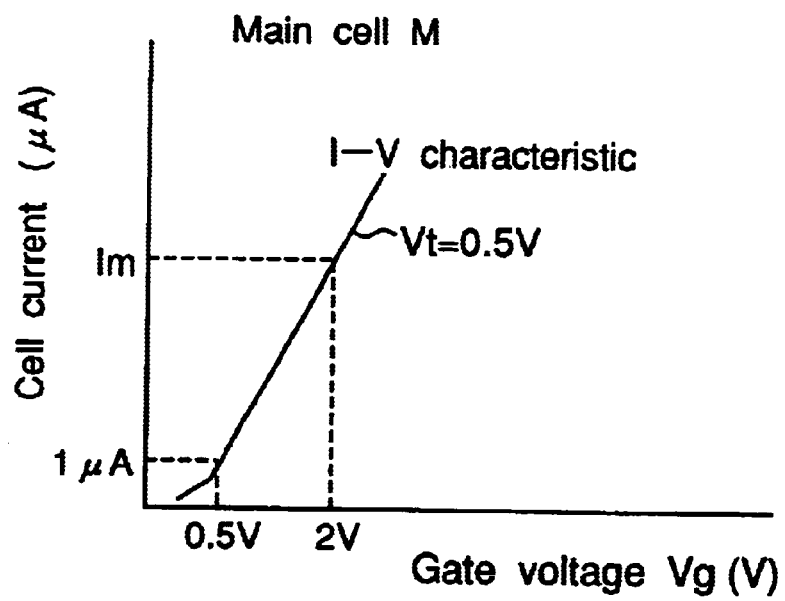
FIG. 16 shows an I–V characteristic of a main cell at the time of conventional overerased cell detection.
Figure 17:
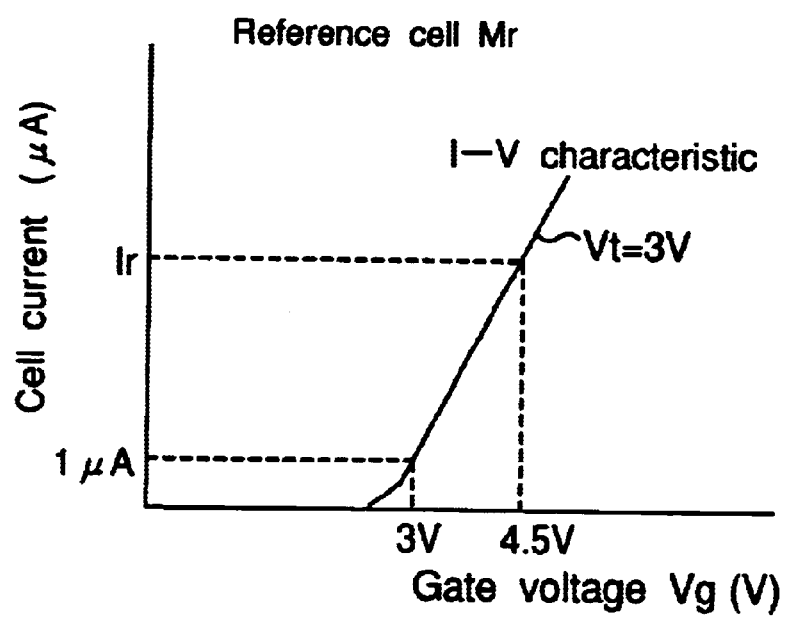
FIG. 17 shows an I–V characteristic of a reference cell at the time of conventional overerased cell detection.

In verify (steps S37, S38, S44 and S45) during the software program processing executed in steps S36 to S50 in this case, 4.5 V is applied to word line WLref of a reference cell Mr whose threshold voltage Vt is set as 3.0 V, 2.0 V is applied to word line WLmain of a selected main cell M, and 0 V is applied to word line WL of an unselected memory cell M. That is, in verify during the software program processing, the same voltages as those in verify in the conventional overerased cell detection processing shown in FIG. 18 are used. I–V characteristics of the main cell M and the reference cell Mr in this case are shown in FIGS. 16 and 17, respectively.

The reason why a detection current value is thus increased in verify during the software program processing is as follows. That is, since a low current (1 $\mu$A) is used for detection in verify (steps S32 and S33) during the overerased cell detection processing performed in steps S31 to S35, the current value is raised to increase sense sensitivity during the software program processing. Furthermore, even when threshold voltages Vt of individual main cells M whose drains are connected to the same bit line BL are higher than 0.5 V and cell currents Im are lower than 1 $\mu$A, a cell current flowing into each main cell M is added and 1 $\mu$A or higher is assumed, the threshold voltage Vt of main cells M whose drains are connected to the bit line BL as a whole may be determined as 0.5 V or lower. Therefore, this case needs to be separately considered. In this case, an increase of a current value also means that sense time in a verify routine during this software program processing is shortened.

In the case of this embodiment, wherein an overerased state is judged by the amount of a current flowing into a bit line BL by using 1 $\mu$A as a reference in the overerased cell detection processing, since a cell current Im of 1 $\mu$A or higher flows when even only one memory cell having a threshold voltage Vt of 0 V or lower exists as shown in FIG. 8, an overerased cell can be determined. However, even when only one memory cell having a threshold voltage Vt of 0–0.5 V exists, judgment omission occurs if the cell current Im is lower than 1 $\mu$A. However, in this case, as described above, a leakage current is suppressed to 1 $\mu$A in maximum.

Thus, when overerase-verify is performed in units of the bit lines, and when 1 bit of an overerased cell exists in a memory cell array, verify time is:

$$512 \text{ (number of bit lines)}/8 \text{ (parallel processing)} \times 1 \text{ } \mu s \text{ (sense time)} +$$
$$0.5 \text{ } \mu s \text{ (sense time)} \times 1024 \text{ (number of word lines)} = 576 \text{ } \mu s$$

Furthermore, even when 2 bits of overerased cells exist in the memory cell array, verify time is:

$$512 \text{ (number of bit lines)}/8 \text{ (parallel processing)} \times 1 \text{ } \mu s \text{ (sense time)} +$$
$$0.5 \text{ } \mu s \text{ (sense time)} \times 1024 \text{ (number of word lines)} \times$$
$$2 \text{ (number of overerased cell bits)} = 1{,}088 \text{ } \mu s \text{ (about 1 ms)}$$

Even there are 2 bits of overerased cells, verify time is shortened in comparison with the aforementioned conventional overerase-verify method. Furthermore, in an actual flash memory array, almost no overerased cell appears, and when the overerase-verify method of this embodiment is used, 64 $\mu$s of overerase-verify time can be achieved in the case of overerase-verify (normal detection). While sense time at the time of overerase-verify is 1 $\mu$s, sense time at the time of specification of an overerased state and recovery of this specified memory cell is as short as 0.5 μs. This is because a current value at the time of sense is increased and high-speed is achieved.

As described above, in this embodiment, verify is performed in a batch in units of bit lines BL at the time of overerase-verify in an erase operation. At this time, in consideration to a distribution state of threshold voltages Vt in a memory cell array after erase pulse application and erase-verify are performed, a cell current of the reference cell Mr and a voltage applied to word line WL of a main cell M are set so as to have a detection level at which there can be one or no memory cell M having a threshold voltage equal to a predetermined threshold voltage Vt (for example, 0.5 V) or lower (overerased state) in one overerase-verify and a leakage current of an unselected memory cell M can be equal to a predetermined current value (for example, 1 μA) or lower in a normal operation.

Therefore, according to this embodiment, high-speed erase can be achieved by largely reducing the number of times verify is performed at the time of overerase-verify to shorten overerase-verify time. Furthermore, the cell current can be reduced to achieve low power consumption. When it is determined that there is a memory cell in an overerased state by the above overerase-verify, re-detection is performed for each word line WL as in the case of the conventional device so that an overerased state is specified and this specified memory cell is recovered. At this time, a judgment current is raised to increase sense sensitivity so that speed to reach stable measurement is increased.

Second Embodiment

In a second embodiment of the present invention, overerase-verify is performed by voltage sense in the same memory cell array configuration in a nonvolatile semiconductor memory device as in the case of the first embodiment.

As in the case of the first embodiment, the following problems arise when current detection is performed by current sense to detect about 1 μA of current in a bit line BL as shown in FIG. 9:

(1) Much time is required before a voltage difference between the reference cell Mr side and the main cell M side is stabilized by a sense amplifier shown in FIG. 9.

(2) Sense sensitivity is low since the current is low.

In this embodiment, there will be explained a method of performing current detection at the time of overerase-verify by voltage sense to detect about a current of 1 μA (low current) in a bit line BL so as to solve the above problems.

The algorithm of an erase operation in this embodiment is executed according to the flow chart shown in FIG. 3 in the same way as that of the erase operation in the first embodiment and. Furthermore, the algorithm of an overerased cell detecting operation in this embodiment is executed according to the flow chart shown in FIG. 5 in the same way as that of the overerased cell detecting operation in the first embodiment.

Furthermore, overerase-verify in an overerased cell detecting operation is the same as that in the first embodiment as follows. Specifically, verify is performed in a batch in units of bit lines. A voltage applied to a word line WL of a main cell M is also set so as to have a detection level at which there can be one or no memory cell M in an overerased state having a threshold voltage equal to a predetermined threshold voltage Vt (for example, 0.5 V) or lower in one overerase-verify. A leakage current of an unselected memory cell M can be a predetermined current value (for example, 1 μA) or lower in a normal operation as in the case of the overerase-verify in the first embodiment.

Furthermore, when it is determined that an overerased cell exists at the time of the overerase-verify, re-detection is performed for each word line WL so that an overerased cell is specified and that this specified overerased cell is recovered. At this time, a current judged by current sense is also raised to increase sense sensitivity and speed to reach stable measurement is increased as in the case of the overerase-verify in the first embodiment. That is, the threshold voltage Vt of the reference cell Mr as shown in FIG. 18 is set as 3.0 V, and a voltage of 4.5 V is applied to word line WLref. Meanwhile, a voltage of 2.0 V is applied to a word line WLmain of a selected main cell M, while a voltage of 0 V is applied to a word line WL of an unselected memory cell M.

Figure 10:
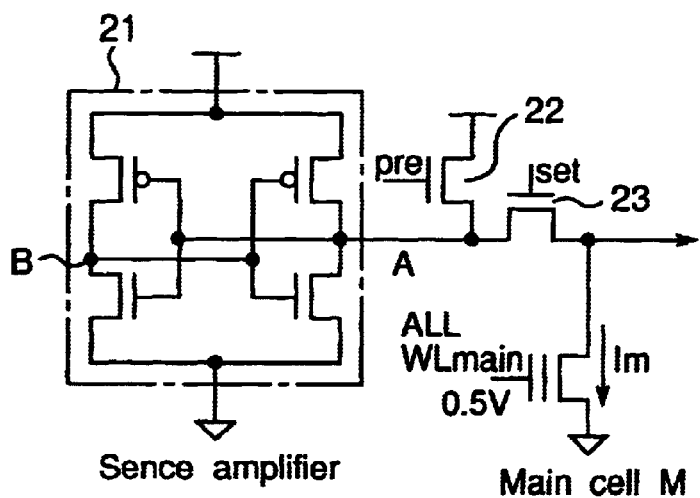
FIG. 10 is a circuit diagram of a sense amplifier for performing current detection by voltage sense.

However, this embodiment is different from the first embodiment in that current detection is performed by voltage sense as shown in FIG. 10 at the time of the overerase-verify (that is, the normal detection routine (steps S31 to S35) of the overerased cell detecting operation shown in FIG. 5).

Figure 11:
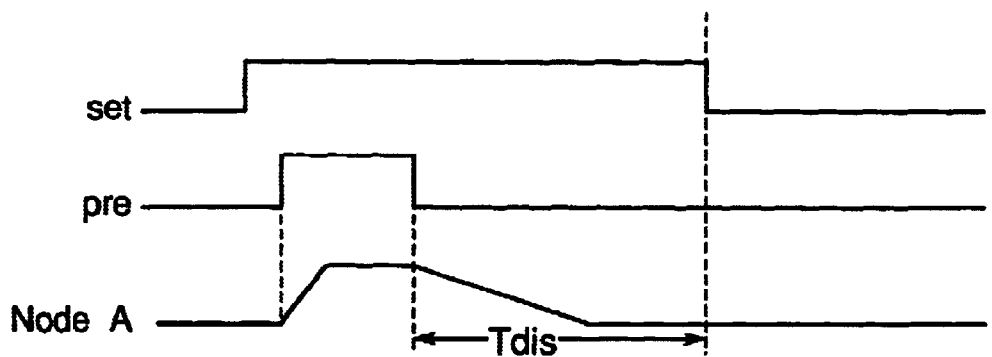
FIG. 11 shows operation timing of the sense amplifier shown in FIG. 10.
Figure 12:
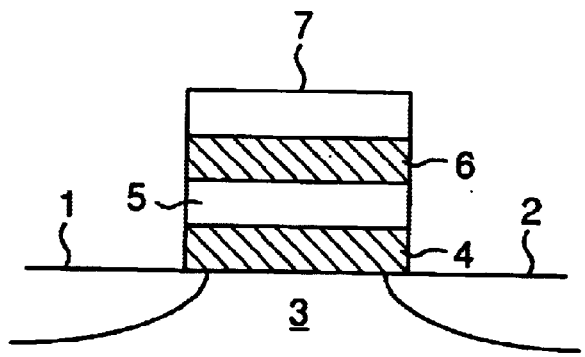
FIG. 12 is a schematic cross sectional view showing an ETOX-type flash memory cell.

In a sense amplifier for voltage sense shown in FIG. 10, a set sense current value (however, there is no reference cell Mr) is 1 μA, and 0.5 V is applied to word lines WLmain of all the main cells M in a block in a batch. The operation timing of the voltage sense in this case is shown in FIG. 11.

As shown in FIG. 10, the sense amplifier is constituted by a latching circuit 21 configured by connecting an input of one of two inverters using a power source voltage and a ground voltage as a power source to an output of the other and connecting an output of the one inverter to an input of the other, an nMOS transistor 22 connected to one output line (node A) of this latching circuit 21 and the power source and an nMOS transistor 23 connected to the node A and bit lines BL of main cells M (1024 memory cells M in units of bit lines BL). Furthermore, a control signal pre is inputted to a gate of the nMOS transistor 22, and a control signal set is inputted to a gate of the nMOS transistor 23.

The sense amplifier having the above configuration performs the following operation to detect a current Im flowing into the main cell M. That is, as shown in FIG. 11, first, a level of the control signal set is set as "H" to turn on the nMOS transistor 23. Consequently, the latching circuit 21, which is a sense system, and a bit line BL of a main cell M to be judged are connected. Subsequently, the level of the control signal pre is set as "H" to turn on the nMOS transistor 22. Then, a current is supplied from the power source via the nMOS transistor 22 to raise a voltage of the node A (precharge). Meanwhile, since the node A rises, the level of the node A is latched as "H" and the level of the node B is latched as "L" in the latching circuit 21.

Thus, when the predetermined precharge voltage is reached, the nMOS transistor 22 is turned off, while 0.5 V is applied to all the word lines WL0 to WL1023 of the main cells M to be judged (1024 memory cells M whose drains are connected to the bit line BL to be judged) in a batch. Then, when a main cell M having a threshold voltage Vt of 0.5 V or lower is included in the main cells M connected to the bit line BL, the cell current Im flows and hence the voltage of the node A lowers. Then, when the voltage of the node A is lower than a predetermined voltage (inversion voltage of the latching circuit 21), the latch voltage of the latching circuit 21 is inverted, and the voltage level of the node A is latched as "L (ground potential)", while the voltage level of the node B is latched as "H (power source voltage)".

Since the latching circuit 21 in this case is rapidly inverted when the voltage of the node A becomes lower than the inversion voltage, speed is high, and sense sensitivity is also high. Furthermore, when the voltage of the node A is inverted, it is determined that a memory cell in an overerased state is included (or, this may be a result of summing up of cell currents of all memory cells), a memory cell in an overerased state is specified and a software program is performed for this specified memory cell for each of the word lines. At the time of verify in this case, as described above, the reference cell Mr of the sense amplifier shown in FIG. 18 is used, a voltage of 4.5 V is applied to the word line WLref of the reference cell Mr, and a voltage of 2.0 V is applied to a word line WLmain of a main cell M. Judgment is similarly performed as shown in the conventional example.

In the above explanation, when a memory cell in an overerased state is specified and a software program is performed for this specified memory cell at the time of an overerased cell detecting operation (the same as the overerased cell detecting operation shown in FIG. 5), current sense is performed by the sense amplifier shown in FIG. 18.

For example, normal sense time at the time of a normal detection routine in the overerased cell detection processing except for specification processing of a memory cell in an overerased state and software program processing for this specified memory cell is 0.5 µs, while processing time when the sense time becomes 1 µs is considered to be (when no overerased cell exists in a memory cell array), $$512 \text{(number of bit lines)}/8 \text{(processed in parallel)} \times 1 \text{ µs (sense time)} = 64 \text{ µs}$$

This shows that processing time is largely reduced in comparison with the processing time of 33 ms at the time of the conventional normal detection routine.

In this embodiment, there is provided a sense amplifier configured by a latching circuit 21, an nMOS transistor 22 for precharging the node A (one output line) of this latching circuit 21 and an nMOS transistor 23 for connecting the node A and a bit line BL of a main cell M. Furthermore, in a normal detection routine of the above overerased cell detection processing, the node A and the bit line BL of the main cell M are connected, and then the level of the control signal pre is set as "H" and the node A is precharged for predetermined time. Then, 0.5 V is applied to word lines WL0 to WL1023 of all main cells M in a batch.

Then, when the latch voltage of the latching circuit 21 is inverted, it is determined that a main cell M having a threshold voltage Vt of 0.5 V or lower is included among the main cells M. Therefore, a leakage current of each bit line BL which is 1 µA or lower can be detected. Furthermore, since voltage sense is performed, a current of about 1 µA can be precisely checked, and, sense time can be made shorter than when current sense is used.

Furthermore, in this embodiment, since the overerase detection routine is performed in units of bit lines BL as in the case of the first embodiment, verify processing needs to be performed only 512/8 times (performed in units of 8 bits)=64 times for 512 bit lines BL, and hence verify time is largely reduced. Furthermore, when an overerased cell exists in the memory cell array, and for example when 1 bit of overerased cell exists in the memory cell array, verify time is:

$$512 \text{(number of bit lines)}/8 \text{(parallel processing)} \times 0.5 \text{ µs (sense time)} +$$
$$0.5 \text{ µs (sense time)} \times 1024 \text{(number of word line)} = 544 \text{ µs}$$

Furthermore, even when 2 bits of the overerased cells exist in the memory cell array, verify time is:

$$512 \text{(number of bit line)}/8 \text{(parallel processing)} \times 0.5 \text{ µs (sense time)} +$$
$$0.5 \text{ µs (sense time)} \times 1024 \text{(number of word line)} \times$$
$$2 \text{(number of overerased cell bits)} = 1,056 \text{ µs (about 1 ms)}$$

In this case as well, verify time is shortened in comparison with the aforementioned conventional overerase-verify method.

Furthermore, almost no overerased cell appears in an actual flash memory array, and, when the overerase-verify method of this embodiment is used, 64 µs of time for verify of overerase detection can be achieved at the time of overerase-verify (normal detecting operation).

In each of the above embodiments, at the time of the overerase-verify (normal detecting operation), a voltage of 0.5 V is applied to a word line WLmain connected to a main cell M as shown in FIGS. 9 and 10, but the applied voltage is not limited to this voltage so long as it is 0–1 V. Thus, by detecting a memory cell M having a threshold voltage Vt of 0–1 V as an overerased cell, a maximum value of a leakage current in a normal operation when detection omission occurs can be restricted to a leakage current of an overerased cell having a threshold voltage of 0 V. Furthermore, one or none of overerased cells positioned in the vicinity of the lower limit in the threshold voltage distribution shown in FIG. 4 can be detected in one overerased cell detection.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A nonvolatile semiconductor memory device comprising:
    a memory cell array including:
        a plurality of floating gate electric field effect transistors arranged in a matrix, each having a control gate, a drain and a source and being capable of electrically writing and erasing information, wherein a threshold voltage of each of the floating gate electric field effect transistors in a written state is higher than a threshold voltage of each of the floating gate electric field effect transistors in an erased state,
        a plurality of row lines connected to control gates of the floating gate electric field effect transistors arranged in a row direction,
        a plurality of column lines connected to drains of the floating gate electric field effect transistors arranged in a column direction, and
        a common line commonly connected to sources of the floating gate electric field effect transistors constituting a block; and
    an erase processing means which performs erase processing where, by controlling voltages applied to the row lines, the column lines and the common line,
        firstly write before erase is performed,
        secondly write-verify before erase is performed,
        thirdly an erase pulse is applied,
        fourthly verify after erase pulse application is performed,
        fifthly first verify is performed to detect an overerased cell,
        sixthly, when an overerased cell is detected in the first verify by applying a voltage to one of the row lines, second verify is performed to specify the overerased cell by applying a voltage different from the voltage applied in the first verify to the row line, and seventhly, when the overerased cell is specified as a result of the second verify, write of a software program is performed for the overerased cell.

2. The nonvolatile semiconductor memory device according to claim 1, wherein the erase processing means has the first verify means which performs the first verify in units of the column lines by applying a voltage to all row lines connected to control gates of the plurality of floating gate electric field effect transistors whose drains are commonly connected to the column line so that one floating gate electric field effect transistor in an overerased state at most exists among the plurality of floating gate electric field effect transistors, and that a leakage current when the floating gate electric field effect transistor in an overerased state is unselected in a normal operation can be equal to a predetermined value or lower.

3. A method of detecting an overerased cell in the nonvolatile semiconductor memory device according to claim 1, wherein pass or failure is determined at time of the first verify and the second verify by comparing a current value of the column line connected to a drain of a reference cell and a current value of the column line connected to a drain of a target cell composed of a floating gate electric field effect transistor to be verified, the reference cell being composed of a floating gate electric field effect transistor which has the same structure as that of the aforementioned floating gate electric field effect transistor and is not written or erased.

4. The method of detecting an overerased cell in a nonvolatile semiconductor memory device according to claim 3, wherein the first verify and the second verify are performed by using the same reference cell.

5. The method of detecting an overerased cell in a nonvolatile semiconductor memory device according to claim 3, wherein a first voltage is lower than a second voltage, a third voltage is lower than a fourth voltage, and the first voltage is lower than the third voltage, where a voltage applied to a row line connected to a control gate of the target cell at time of the first verify is defined as the first voltage, a voltage applied to a row line connected to a control gate of the reference cell at time of first verify is defined as the second voltage, a voltage applied to the row line connected to the control gate of the target cell at time of the second verify is defined as the third voltage, and a voltage applied to the row line connected to the control gate of the reference cell at time of the second verify is defined as the fourth voltage.

6. The method of detecting an overerased cell in a nonvolatile semiconductor memory device according to claim 3, wherein current values in the reference cell and the target cell are compared by a sense amplifier, and at time of the first verify, a predetermined voltage for detecting an overerased cell is applied to all the row lines in the block, while the column lines are successively selected and connected to the sense amplifier to detect the overerased cell in units of the column lines.

7. The method of detecting an overerased cell in a nonvolatile semiconductor memory device according to claim 6, wherein at time of the second verify, a voltage different from the voltage applied to the row lines at time of the first verify is successively applied to the row lines, and only a column line determined as including an overerased cell at time of the first verify is connected to the sense amplifier so as to specify the overerased cell in units of individual target cells.

8. The method of detecting an overerased cell in a nonvolatile semiconductor memory device according to claim 3, wherein the floating gate electric field effect transistor having a threshold voltage between 0 and 1 V inclusive in the memory cell array is detected as the overerased cell at time of the first verify and the second verify.

9. A method of detecting an overerased cell in the nonvolatile semiconductor memory device according to claim 1, wherein pass or failure at time of the first verify is determined based on a voltage value of the column line connected to the drain of a target cell composed of a floating gate electric field effect transistor to be verified, and pass or failure at time of the second verify is determined by comparing a current value of the column line connected to the drain of a reference cell and a current value of the column line connected to the drain of the target cell, the reference cell being composed of a floating gate electric field effect transistor which has the same structure as that of the aforementioned floating gate electric field effect transistor and is not written or erased.

10. The method of detecting an overerased cell in a nonvolatile semiconductor memory device according to claim 9, wherein a voltage between 0 and 1 V inclusive is applied to the row line connected to the control gate of the target cell at time of first verify.

11. The method of detecting an overerased cell in a nonvolatile semiconductor memory device according to claim 9, wherein a voltage of a column line connected to the target cell is detected by a sense amplifier at time of the first verify, and a leakage current to be detected is controlled by controlling time when the column line connected to the drain of the target cell is connected to the sense amplifier.

12. The method of detecting an overerased cell in a nonvolatile semiconductor memory device according to claim 9, wherein a sixth voltage is lower than a seventh voltage, where a voltage applied to a row line connected to the control gate of the target cell at time of the first verify is defined as a fifth voltage, a voltage applied to the row line connected to the control gate of the target cell at time of second verify is defined as the sixth voltage, and a voltage applied to a row line connected to the control gate of the reference cell at time of the second verify is defined as the seventh voltage.

13. The method of detecting an overerased cell in a nonvolatile semiconductor memory device according to claim 9, wherein a voltage value of the column line connected to the target cell is detected by a first sense amplifier, and at time of the first verify, a predetermined voltage for detecting an overerased cell is applied to all the row lines in the block, and the column lines are successively selected to be connected to the first sense amplifier so as to detect the overerased cell in units of the column lines.

14. The method of detecting an overerased cell in a nonvolatile semiconductor memory device according to claim 13, wherein current values in the reference cell and the target cell are compared by a second sense amplifier at time of the second verify, and at time of the second verify, a voltage different from the voltage applied to the row line at time of the first verify is successively applied at time of the second verify, and only column lines determined as including an overerased cell at time of the first verify are successively connected to the second sense amplifier so as to specify the overerased cells in units of individual target cells.

* * * * *